(12) United States Patent
Yamada

(10) Patent No.: US 10,118,266 B2
(45) Date of Patent: Nov. 6, 2018

(54) TRANSFER ROBOT WITHOUT A WIRE CONNECTION BETWEEN FIXED AND MOVING PARTS

(71) Applicant: DAIHEN Corporation, Osaka-shi, Osaka (JP)

(72) Inventor: Takaya Yamada, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 15/686,626

(22) Filed: Aug. 25, 2017

(65) Prior Publication Data

US 2018/0056463 A1 Mar. 1, 2018

(30) Foreign Application Priority Data

Aug. 29, 2016 (JP) .................. 2016-166404

(51) Int. Cl.
*B23Q 7/04* (2006.01)
*H01L 21/677* (2006.01)
*H01L 21/687* (2006.01)

(52) U.S. Cl.
CPC ........ *B23Q 7/046* (2013.01); *H01L 21/67709* (2013.01); *H01L 21/68707* (2013.01); *H01L 21/67742* (2013.01)

(58) Field of Classification Search
CPC .............. B23Q 7/016; H01L 21/67709; H01L 21/68707
USPC ................. 294/213; 414/571.1, 941
See application file for complete search history.

(56) References Cited

U.S. PATENT DOCUMENTS

| 5,789,843 | A | * | 8/1998 | Higuchi | ................ | B65G 54/02 310/309 |
| 5,989,342 | A | * | 11/1999 | Ikeda | ...................... | B05C 11/08 118/319 |
| 6,160,338 | A | * | 12/2000 | Ono | ........................ | G03F 7/707 310/12.06 |
| 6,752,585 | B2 | * | 6/2004 | Reimer | ................ | H01L 21/681 414/783 |
| 2013/0147437 | A1 | * | 6/2013 | Yamada | ................ | H02J 7/0068 320/128 |
| 2014/0086717 | A1 | | 3/2014 | Miyamoto et al. | | |

FOREIGN PATENT DOCUMENTS

JP 2014-65092 A 4/2014

* cited by examiner

*Primary Examiner* — Paul T Chin
(74) *Attorney, Agent, or Firm* — Hamre, Schumann, Mueller & Larson, P.C.

(57) ABSTRACT

A transfer robot includes a supporting part, a moving part, a magnet unit, and a coil. The moving part is supported by the supporting part and movable along a predetermined travel path. The moving part is provided with a hand for carrying a workpiece. The magnet unit is disposed at the supporting part and extends longitudinally along the travel path. The magnetic unit generates magnetic flux that is at least partially perpendicular to the travel path. The coil is disposed at the moving part and intersects the magnetic flux. The magnetic flux varies or is different at positions along the travel path.

14 Claims, 13 Drawing Sheets

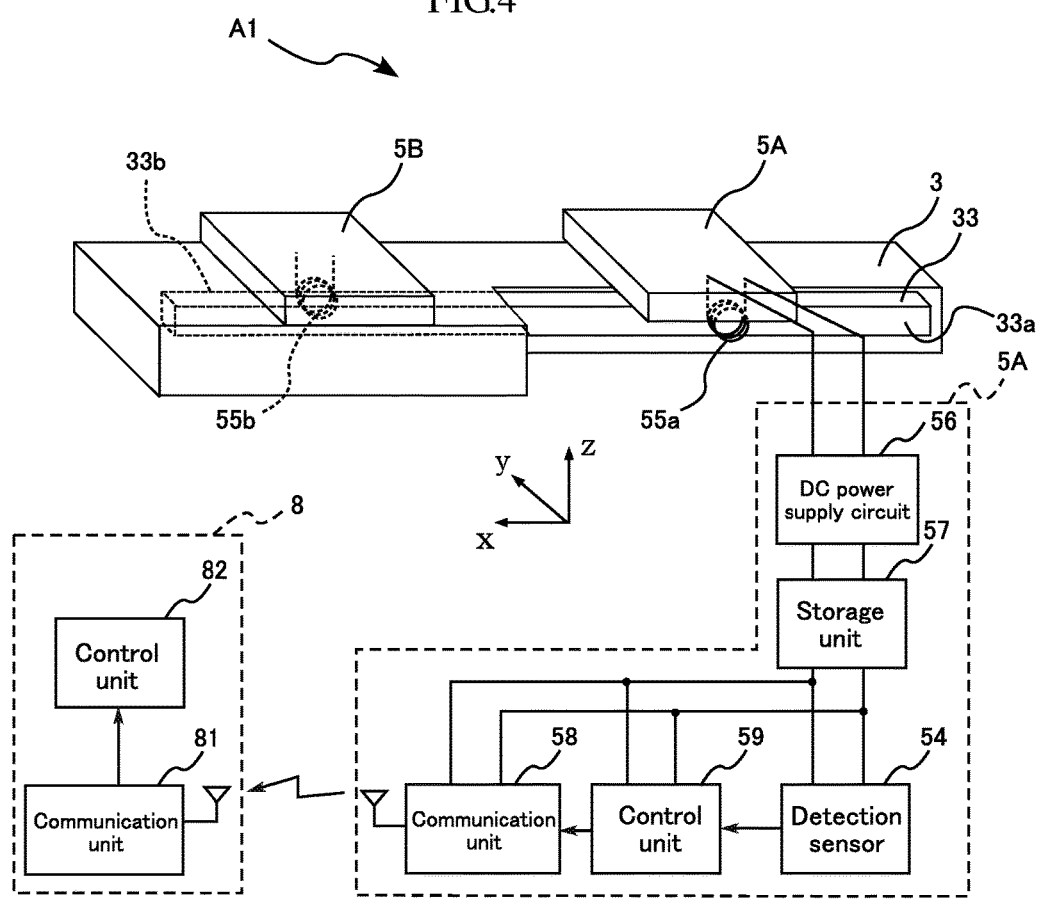

TRANSFER ROBOT WITHOUT A WIRE CONNECTION BETWEEN FIXED AND MOVING PARTS

FIELD

The present disclosure relates to a transfer robot for transferring a workpiece, such as a substrate.

BACKGROUND

Transfer robots are employed in industrial fields, including the manufacture of liquid crystal display panels, to transfer thin workpieces, such as glass substrates. Typically, transfer robots are used to carry workpieces into and out of process chambers in the steps of manufacturing liquid crystal panels.

Some known transfer robots have a sliding mechanism (linear motion mechanism) that moves a hand of the robot along a horizontal linear path. JP-A-2014-65092 discloses an example of a transfer robot having a hand that moves along a horizontal linear path. The transfer robot disclosed in JP-A-2014-65092 includes a moving part mounted on a pair of linear guide rails supported on a guide body (supporting part) and drives the moving part by a belt drive mechanism. The guide body is movable up and down and rotatable. In this linear motion mechanism, the moving part is moved linearly along the guide rails (supported on the guide body) by the driving force supplied from the belt drive mechanism. The moving part is provided with a hand on which a workpiece is to be placed, and the hand is provided with a detection sensor that detects a workpiece placed on the hand.

The detection sensor and a control unit are connected via wiring that is divided into a section located on the guide body and a section located on the moving part. The sections of wiring are connected when the hand extends beyond the guide body to reach a transfer position where a workpiece can be passed or received and when the hand is retracted back to an initial position where the hand rotates. The detection of a workpiece can be performed when the hand is at the transfer position and at the initial position.

Unfortunately, there is a problem that the detection of a workpiece cannot be performed when the hand is at positions other than the transfer position and the initial position. Another problem is that particles may be generated by the wire terminals contacting each other when the sections of wiring are connected. However, constantly connecting the detection sensor and the control unit via wiring may lead to disadvantages. For example, particles may be generated at a sliding section of a cable guide (such as Cableveyor, registered trademark) that stores wires inside, or the sliding section may be damaged. In addition, the cable guide may interfere with the rotational or other motion of the transfer robot. Further, the wiring itself may be damaged or disconnected through repeated bending in different states.

SUMMARY

The present disclosure is proposed in view of the foregoing circumstances and aims to provide a transfer robot that does not require wire connection between a supporting part and a moving part.

According to an aspect of the disclosure, there is provided a transfer robot that includes: a supporting part; a moving part supported by the supporting part and movable along a predetermined travel path, where the moving part is provided with a hand for carrying a workpiece; a magnet unit disposed at the supporting part and extending longitudinally along the travel path, where the magnetic unit generates magnetic flux perpendicular to the travel path; and a coil disposed at the moving part and intersecting the magnetic flux. The magnetic flux perpendicular to the travel path is different at positions along the travel path.

Preferably, the moving part may include a rectifying circuit for rectifying an electric current flowing through the coil, and a power storage for storing direct current power outputted from the rectifying circuit.

Preferably, the magnet unit may be made up of a plurality of permanent magnets that are arranged, in particular spaced apart from each other, along the travel path. Each permanent magnet may have an N pole and an S pole that are spaced apart from each other in a direction perpendicular to the travel path. In an embodiment, each permanent magnet is elongated in the direction perpendicular to the travel path.

Preferably, any two adjacent magnets of the plurality of permanent magnets may have mutually opposite N-S directions.

Preferably, the N pole and the S pole of each permanent magnet may be spaced apart from each other in a horizontal direction.

Preferably, the N pole and the S pole of each permanent magnet may be spaced apart from each other in a vertical direction.

Preferably, the supporting part may include a straight guide rail extending horizontally, and the moving part may move on the guide rail.

Preferably, the transfer robot may further include a plurality of cooperating arms configured to move the moving part along the travel path, which may be a horizontal, straight path.

Preferably, the moving part may be rotatable relative to the supporting part.

Preferably, the moving part may be an electrical load to be driven by electric power outputted from the coil.

Preferably, the electrical load may be a combination of a detection sensor for detecting a workpiece and a communication unit for transmitting results of detection by the detection sensor.

Preferably, the electrical load may be a gripping mechanism for gripping a workpiece.

Preferably, the transfer robot may further include at least one additional moving part.

With the configuration of the present disclosure, the magnetic flux intersecting the coil changes as the moving part moves along the travel path. Due to the change, electric current is induced in the coil by electromagnetic induction. In this way, electric power can be supplied to the electrical load provided on the moving part, without using a wire to connect the supporting part and the moving part.

Further features and advantages of the present disclosure will become apparent from the following detailed description with reference to the attached drawings.

BRIEF DESCRIPTION OF THE DRAWINGS

FIG. 4 is a schematic perspective view of the transfer robot according to the first embodiment, illustrating electric power supply in the transfer robot.

DESCRIPTION OF THE PREFERRED EMBODIMENTS

Preferred embodiments will be described below with reference to the accompanying drawings.

Figure 1:
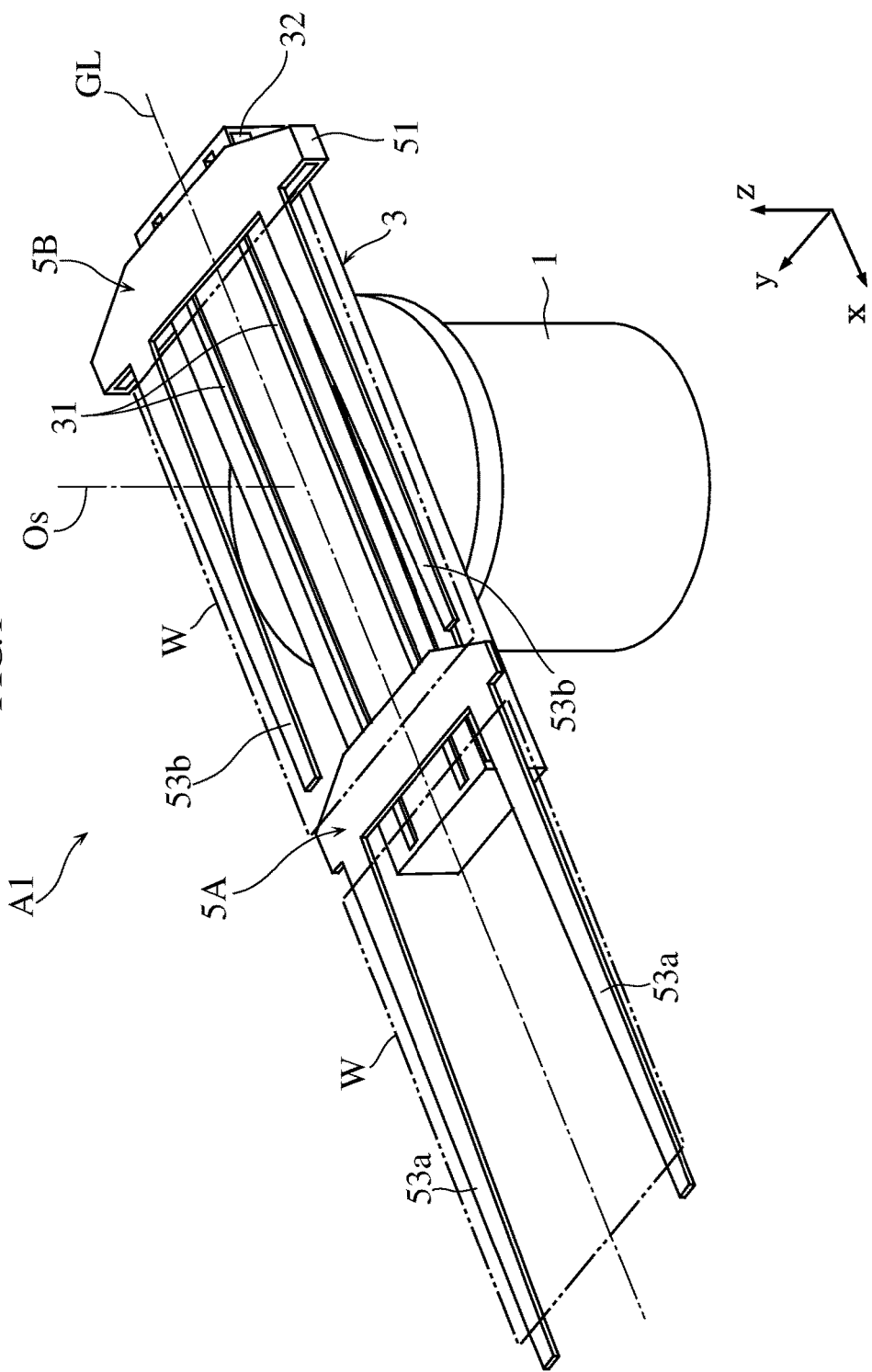
FIG. 1 is a perspective view of a transfer robot according to a first embodiment.
Figure 2:
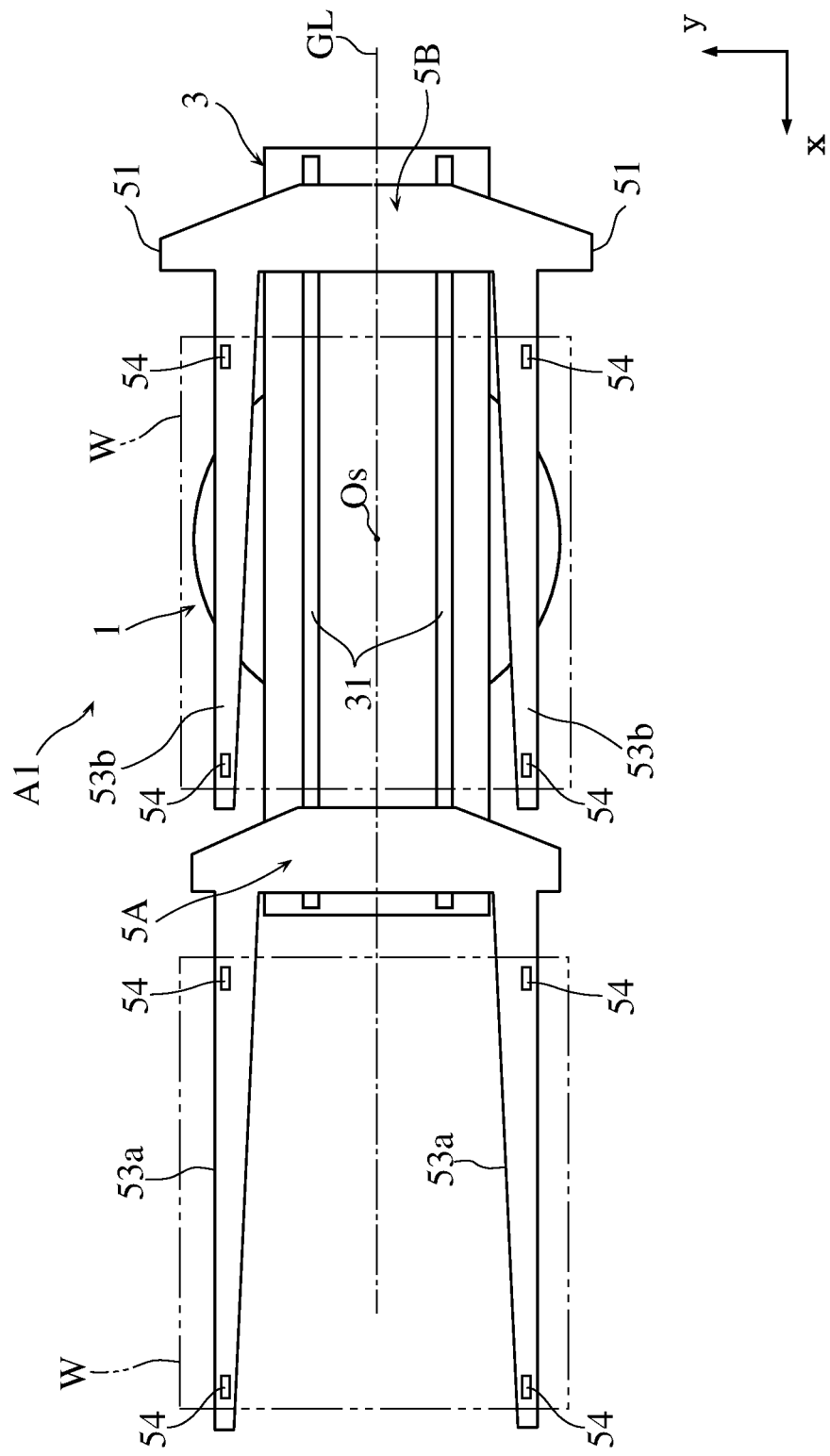
FIG. 2 is a plan view of the transfer robot according to the first embodiment.
Figure 3:
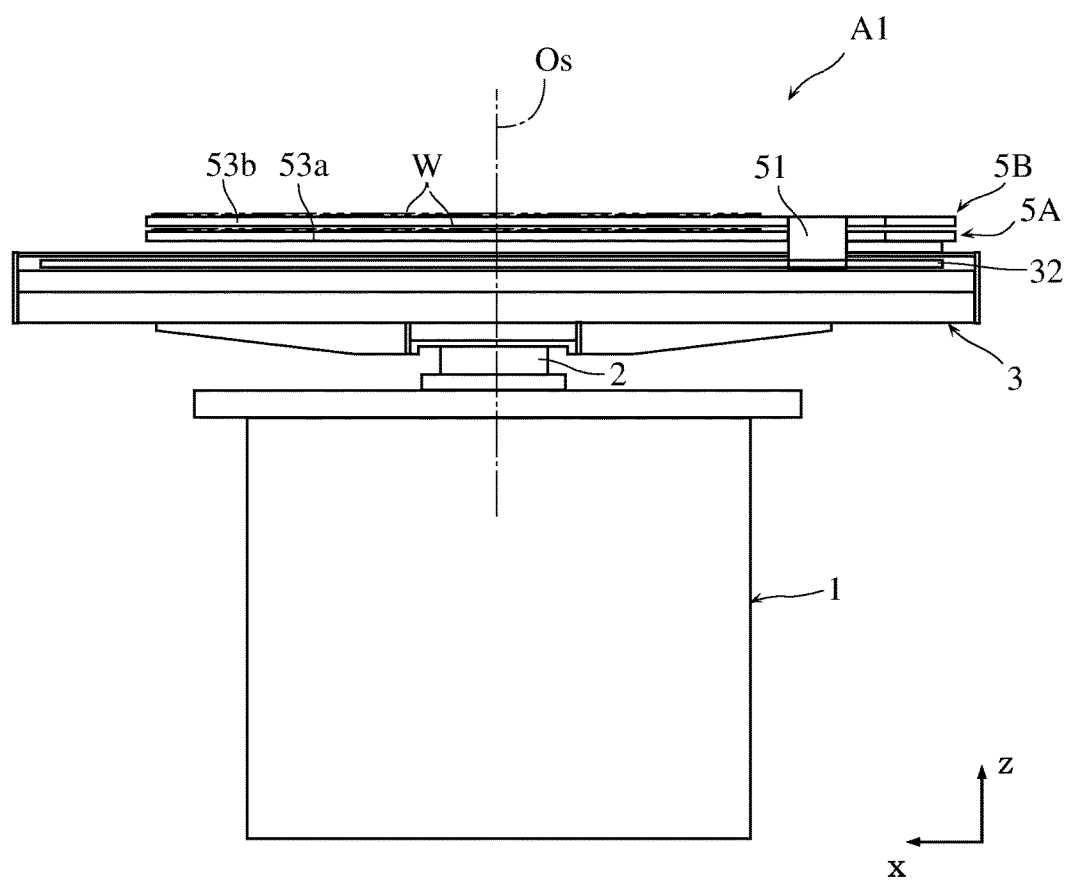
FIG. 3 is a side view of the transfer robot according to the first embodiment.

FIGS. 1 to 3 show a transfer robot A1 according to a first embodiment. FIG. 1 is a perspective view of the entirety of the transfer robot A1. FIG. 2 is a plan view of the transfer robot A1. FIG. 3 is a plan view of the transfer robot A1, with a moving part 5A located at a different position than in FIGS. 1 and 2.

The transfer robot A1 is used to transport a thin workpiece W, such as a glass substrate for a liquid crystal display panel. In the present embodiment, the transfer robot A1 is a vacuum robot that handles a workpiece W in a vacuum environment. In addition, the transfer robot A1 has two hands. As shown in FIGS. 1 to 3, the transfer robot A1 includes a fixed part 1, a rotating part 2, a guide body 3 and moving parts 5A and 5B. FIGS. 1 to 3 are illustrated based on a local coordinate system having an x direction coinciding with a moving direction of the moving parts 5A and 5B, a y direction perpendicular to the x direction within a horizontal plane and a z direction that is the vertical direction (the same applies to the other figures). The local coordinate system is defined relative to the rotating part 2. Hence, the x and y directions rotate as the rotating part 2 rotates, and the z direction translates as the rotating part 2 moves up and down.

The fixed part 1 is fixed on the floor surface and supports the rotating part 2 so as to allow up and down movement and rotational movement. Note that the fixed part 1 may be movable in a direction parallel to the xy plane defined by the x and y directions. In the present embodiment, the fixed part 1 is a bottomed cylinder made of aluminum and has a flange around the top. However, the fixed part 1 is not limited to the illustrated example, and may have a different shape and dimension and/or may be made of a different material.

The rotating part 2 is a hollow cylinder made of aluminum and disposed in the fixed part 1 so as to extend beyond the opening of the fixed part 1. However, the rotating part 2 is not limited to any specific shape, dimensions or material. The rotating part 2 is movable up and down. In addition, the rotating part 2 is rotatable relative to the fixed part 1, about a rotation axis Os extending in the z direction. The mechanism for moving the rotating part 2 up and down, as well as the mechanism for rotating the rotating part 2, is not shown in the figures and not described here. The rotating part 2 can be rotated to change the orientation of the guide body 3 and consequently to change the moving direction of the moving parts 5A and 5B. In addition, the rotating part 2 can be moved up and down to change the vertical position of the guide body 3.

The guide body 3 is made of aluminum and has the shape of a rectangular box. However, the guide body 3 is not limited to any specific shape, dimensions or material. The guide body 3 contains two pairs of guide rails for supporting the respective moving parts 5A and 5B, and two drive mechanisms each having a motor and a belt for driving the respective moving parts 5A and 5B. The guide body 3 is fixed to the rotating part 2 and thus rotates with the rotating part 2 and moves up and down with the rotating part 2.

The moving parts 5A and 5B are slidable relative to the guide body 3 along a travel path GL that extends horizontally linearly in the x direction. The moving part 5A has a pair of support arms (now shown) on the lower surface. The support arms are inserted into slits 31 (FIG. 1) formed though the upper surface of the guide body 3, supported by the corresponding pair of guide rails disposed inside the guide body 3, and coupled to the belt of the corresponding drive mechanism. This configuration enables the moving part 5A to move on the guide rails. The moving part 5B has a pair of support arms 51 that are movable along the sides of the moving part 5A without interfering with the moving part 5A. The support arms 51 are inserted in slits 32 (FIG. 3) each formed though a side surface of the guide body 3, supported on the corresponding pair of guide rails disposed inside the guide body 3, and coupled to the belt of the corresponding drive mechanism. This configuration enables the moving part 5B to move on the guide rails. In this way, the moving parts 5A and 5B are movable independently of each other and without making any contact with each other.

The moving part 5A has an integral hand 53$a$ extending in the longitudinal direction (x direction) of the guide body 3. Similarly, the moving part 5B has an integral hand 53$b$. Each of the hands 53$a$ and 53$b$ includes two prongs for holding a thin workpiece W horizontally thereon. In the present embodiment, the moving parts 5A and 5B are made of aluminum. However, the moving parts 5A and 5B are not limited to any particular shape, dimensions or material.

On the upper surfaces of the hands 53$a$ and 53$b$, detection sensors 54$b$ (see FIG. 2) are provided to detect a workpiece W held on the hands 53$a$ and 53$b$. In the present embodiment, each of the hands 53$a$ and 53$b$ is provided with four detection sensors 54 as shown in FIG. 2, such that one detection sensor 54 is located at the base end and another at the tip end of each prong of the hand 53$a$ (53B).

In the present embodiment, each detection sensor 54 may have a lever switch that is upwardly urged, for example. The switch opens in the absence of a workpiece W placed on the hand. In the presence of a workpiece W placed on the hand, the switch closes under the weight of the workpiece W. In this way, a workpiece W placed on the hand 53$a$ (53$b$) is detected. The detection sensors 54 may have another configuration for detecting a workpiece W placed on a predetermined position on the hand 53$a$ (53$b$). For example, reflective photosensors may be usable. A detection signal regarding the detection of a workpiece W performed by the detection sensors 54 is wirelessly transmitted from a communication unit to a control device. A mechanism for supplying electric power to the detection sensors 54 and the communication unit will be described later.

FIGS. 1 and 2 show the moving part 5A (hand 53a) with the hand extending beyond the guide body 3 to reach a transfer position at which a workpiece W can be received or passed. In contrast, FIG. 3 shows the moving part 5A (hand 53a) at a predetermined position (initial position) above the fixed part 1. The moving parts 5A and 5B are placed at the initial position when the rotating part 2 rotates or when the moving parts 5A and 5B are not operating. The moving parts 5A and 5B linearly reciprocate at high speed between the initial position and the transfer position and rests either at the initial position or the transfer position. In the state shown in FIGS. 1 to 3, the moving part 5B (hand 53b) is at the initial position.

The transfer robot A1 rotates the rotating part 2 to change the moving direction (x direction) of the moving part 5A (hand 53a) and the moving part 5B (hand 53b), moves the rotating part 2 up and down to change the vertical position of the moving part 5A (hand 53a) and the moving part 5B (hand 53b), and moves the moving part 5A (hand 53a) and the moving part 5B (hand 53b) in the x direction. Thorough these operations, the transfer robot A1 loads a workpiece into a process chamber and removes the workpiece from the process chamber.

Next, the transfer robot A1 is described regarding the way to supply electric power to the detection sensors 54 and the communication unit.

The transfer robot A1 includes magnets provided inside the guide body 3 and power generation coils provided inside the respective moving parts 5A and 5B. By sliding the moving parts 5A and 5B relative to the guide body 3, electric power is generated by electromagnetic induction. The resulting electric power is stored on the power storage and supplied to the detection sensors 54 and the communication unit.

Figure 5A:
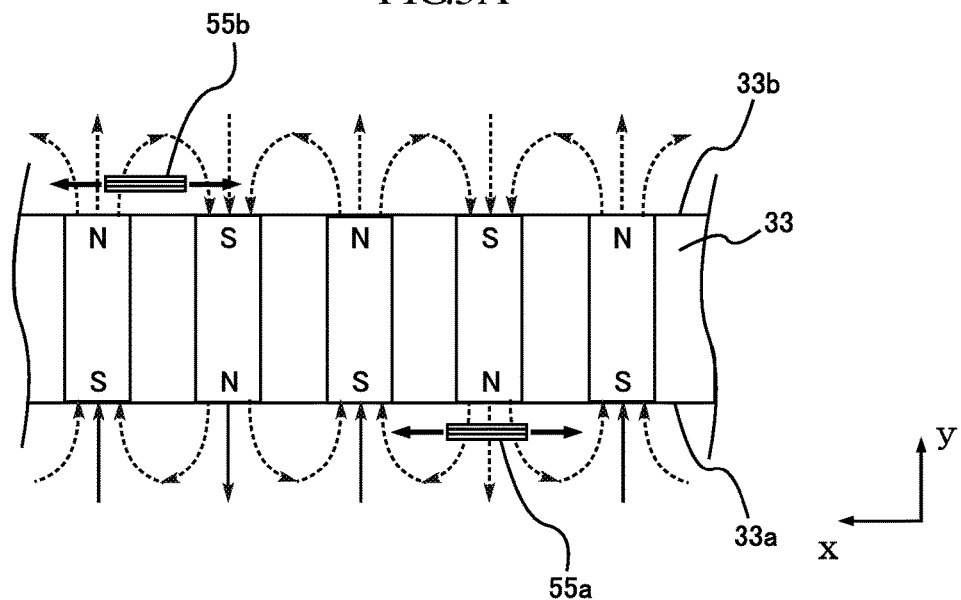
FIGS. 5A and 5B show the relative positions of the magnet unit relative to coils.
Figure 5B:
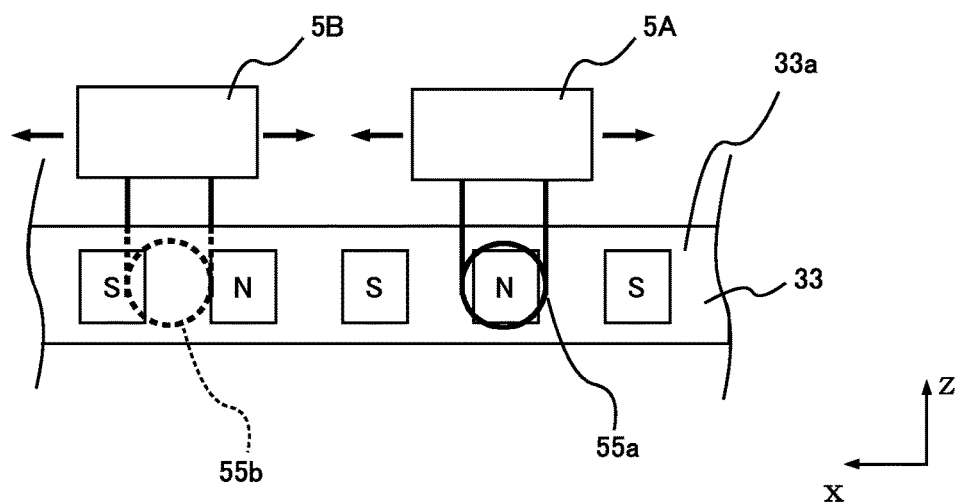

FIGS. 4, 5A and 5B illustrate how electric power is supplied in the transfer robot A1. FIG. 4 is a perspective schematic view of the transfer robot A1. In FIG. 4, the moving parts 5A and 5B are shown simply as rectangular boxes, and the moving parts 5A and 5B are conveniently shown at the same positions in terms of the z direction (the same applies to FIGS. 5A, 5B, 8A to 8C, 9A and 9B). In addition, the guide body 3 is shown with a portion broken away. FIGS. 5A and 5B show the relative positions of a magnet unit 33 and coils 55a and 55b. FIG. 5A is as viewed from the z direction, and FIG. 5B from the y direction.

The guide body 3 is provided with the magnet unit 33. The magnet unit 33 includes a plurality of permanent magnets arranged in the shape of a rectangular box elongated in the x direction. As shown in FIGS. 5A and 5B, a predetermined number of permanent magnets are arranged in the x direction (in the illustrated example, without limitation, the permanent magnets are spaced apart from each other in the x direction) to be parallel to each other, with each magnet having the N pole and the S pole spaced away in the y direction. In addition, each permanent magnet is oriented to have the N pole and the S pole opposite to the poles of the adjacent permanent magnet (s). In other words, each magnet has its N-S direction (or N-S sense) proceeding from the N pole to the S pole, and the N-S directions of any two adjacent magnets are opposite to each other.

In the present embodiment, the permanent magnets are spaced apart from each other in the x direction. Alternatively, the permanent magnets may be arranged in intimate contact with one another, leaving no gap therebetween. As shown in FIG. 4, the magnet unit 33 is fixed inside the guide body 3. The magnet unit 33 has magnetic-flux generating surfaces 33a and 33b perpendicular to the y-direction. The magnetic-flux generating surfaces 33a and 33b generate a magnetic flux in the y direction. In the present embodiment, as shown in FIG. 4, the magnetic-flux generating surface 33a is the one shown closer toward the viewer, whereas the magnetic-flux generating surface 33b is the one opposite to the magnetic-flux generating surface 33a. As indicated by the magnetic lines of force (see dashed arrows) shown in FIG. 5A, the direction of the magnetic flux is reversed alternately along the respective magnetic-flux generating surfaces 33a and 33b in the x direction.

The moving part 5A includes the coil 55a, a direct current (DC) power supply circuit 56, a power storage 57, a communication unit 58, a control unit 59, and the detection sensors 54. The DC power supply circuit 56, the power storage 57, the communication unit 58 and the control unit 59 are located inside the moving part 5A.

The coil 55a is located under the moving part 5A such that the coil plane faces the magnetic-flux generating surface 33a. The coil 55a moves in the x direction with the moving part 5A (see solid arrows shown in FIGS. 5A and 5B). Through the movement, the magnetic flux that intersects the coil plane varies (in other words, the flux becomes different at positions along the travel path). Thus, by electromagnetic induction, electromotive force is generated between the terminals of the coil 55a and electric current is induced in the coil 55a. Since the direction of magnetic flux from the magnetic-flux generating surface 33a is reversed alternately along the x direction, the magnitude and direction of the magnetic flux intersecting the coil 55a changes. Consequently, the coil 55a outputs alternating current (AC) power.

Figure 6A:
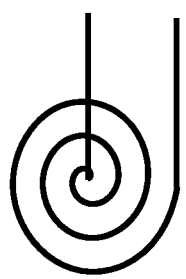
FIGS. 6A-6C show variations of the coils.
Figure 6B:
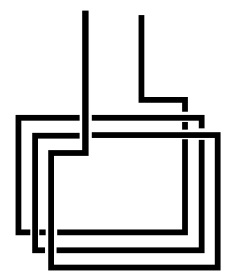
Figure 6C:
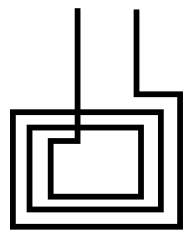

In the present embodiment, the coil 55a is a cylindrical coil formed of a plurality of turns of wire (a solenoid formed of wire wound in the shape of a helix elongated in a direction perpendicular to the coil plane). Note that the coil 55a is not limited to any specific shape or number of turns. For example, the coil may have a single turn of wire. In another example, the coil may be a circular spiral coil (formed of wire wound coplanar with the coil plane) as shown in FIG. 6A. The coil 55a having this configuration generates a greater electromotive force without increasing the thickness (y-direction dimension) of the coil 55a. Alternatively, the coil may be formed of wire wound in the shape of a rectangular tube as shown in FIG. 6B or in a rectangular spiral as shown in FIG. 6C.

The DC power supply circuit 56 converts AC power received from the coil 55a and outputs the resulting DC power to the power storage 57. Although not illustrated, the DC power supply circuit 56 includes a rectifying circuit, a smoothing circuit and a DC/DC converting circuit. The rectifying circuit may be a full-wave rectifying circuit having four bridge-connected diodes. AC voltage supplied to the rectifying circuit is rectified to DC voltage, which is then outputted to the smoothing circuit. The DC voltage supplied from the rectifying circuit is smoothed by the smoothing circuit and outputted to the DC/DC converting circuit. The DC voltage supplied from the smoothing circuit is converted by the DC/DC converting circuit to a predetermined voltage and outputted to the power storage 57. The DC power supply circuit 56 is not limited to any specific configuration, and any circuit configuration converting AC power to DC power is applicable.

The power storage 57 stores DC power supplied from the DC power supply circuit 56. The power storage 57 is a condenser in the present embodiment but may alternatively be a secondary battery, such as a lithium-ion battery. The power storage 57 can store electric power generated through the movement of the moving part 5A. This configuration ensures that power is supplied to the detection sensors 54 and other elements during the time the moving part 5A is not moving and thus electric power is not generated. The power storage 57 supplies power to the communication unit 58, the control unit 59 and the detection sensors 54.

The detection sensors 54 determines whether a workpiece W is present and outputs a detection signal to the control unit 59. The control unit 59 outputs the detection signal received from the detection sensors 54 to the communication unit 58 and causes the communication unit 58 to transmit the detection signal. The communication unit 58 transmits the detection signal to a control device 8 by way of wireless communication.

The control device 8 controls the transfer robot A1 by controlling the parts of the transfer robot A1 in accordance with a preset program and various signals inputted thereto. The detection signal transmitted from the communication unit 58 is received by a communication unit 81 and inputted to the control unit 82 and used in the control. The control device 8 may be provided inside the fixed part 1 or connected to the fixed part 1 with a cable. The communication unit 81 may be provided inside the guide body 3 and connected to the control device 8 with a cable.

The moving part 5B is provided with the coil 55b. Although not shown in FIG. 4, the moving part 5B additionally includes a DC power supply circuit 56, a power storage 57, a communication unit 58 and a control unit 59. The DC power supply circuit 56, the power storage 57, the communication unit 58 and the control unit 59 provided inside the moving part 5B are similar to those provided inside the moving part 5A.

The coil 55b is located under the moving part 5B such that the coil plane faces the magnetic-flux generating surface 33b. That is, the coil 55b is located on the side opposite to the coil 55a across the magnet unit 33. Alternatively, the coil 55b may be positioned such that the coil plane faces the magnetic-flux generating surface 33a. In other words, the coil 55b may be located on the same side as the coil 55a. In this case, it is necessary to ensure that the coils 55a and 55b stay clear of each other as the moving parts 5A and 5B move. The coil 55b moves in the x direction with the moving part 5B (see solid arrows shown in FIGS. 5A and 5B). Through the movement, the magnetic flux that intersects the coil plane varies. Thus, by electromagnetic induction, electromotive force is generated between the terminals of the coil 55b and electric current is induced in the coil 55b. Since the direction of magnetic flux from the magnetic-flux generating surface 33b is reversed alternately along the x direction, the magnitude and direction of the magnetic flux intersecting the coil 55b changes. Consequently, the coil 55b outputs AC power in a manner similar to the coil 55a.

Next, the transfer robot A1 according to the present embodiment will be described with respect to the working and advantages.

In the present embodiment, the magnetic flux intersecting the coil plane of the coil 55a (55b) changes as the moving part 5A (5B) moves along the travel path GL. As a result, electric current is induced in the coil 55a (55b) by electromagnetic induction and thus the coil 55a (55b) outputs AC power. Therefore, electric power can be supplied to the detection sensors 54 mounted on the moving part 5A (5B) without providing wiring that connects the guide body 3 and the moving part 5A (5B). In this way, the present embodiment can avoid the inconveniences associated with wiring that connects the guide body 3 and the moving part 5A (5B).

In the present embodiment, AC power outputted from the coil 55a (55b) is converted by the DC power supply circuit 56 to the DC power and stored on the power storage 57. This configuration ensures that power is supplied to the detection sensors 54 and other elements during the time the moving part 5A (5B) is not moving and thus electric power is not generated.

In the present embodiment, the permanent magnets included in the magnet unit 33 are arranged such that each permanent magnet has the N pole and the S pole opposite to the polarity of an adjacent permanent magnet. This arrangement causes a greater change in the magnetic flux intersecting the coil plane of the coil 55a (55b) when the moving part 5A (5B) moves along the travel path GL. Consequently, the electromotive force induced by electromagnetic induction is increased.

In the present embodiment, two moving parts 5A and 5B are provided to achieve a greater work efficiency than with a single moving part.

In the first embodiment described above, the magnet unit 33 is configured such that the magnetic flux crossing the magnetic-flux generating surface 33a (33b) changes its direction at different positions along the x direction. However, the present disclosure is not limited thereto. For example, the permanent magnets included in the magnet unit 33 may be oriented to have their respective N poles (or S poles) located on the same side of the elongated magnet unit 33, and consequently the direction of the magnetic flux does not change (remains the same) along the x direction. In this arrangement, due to the gaps provided between adjacent permanent magnets, the magnetic flux intersecting the coil plane of the coil 55a (55b) changes as the moving part 5A (5B) moves, whereby the coil 55a (55b) outputs AC power.

In the first embodiment described above, the magnet unit includes permanent magnets. However, the present disclosure is not limited thereto. The magnets included in the magnet unit 33 may be electromagnets, for example. In this case, it may be sufficient to generate magnetic flux only when the moving part 5A (5B) is in motion.

In the first embodiment described above, two moving parts 5A and 5B are provided. However, the present disclosure is not limited thereto and a single moving part or three or more moving parts may be provided. A greater number of moving parts more effectively improve the work efficiency, while a fewer number of moving parts more effectively simplify the configuration.

In the first embodiment described above, the hand 53a (53b) is provided with the detection sensors 54. However, the present disclosure is not limited thereto. The hand 53a (53b) may be provided with a different electrical load, such as a gripping mechanism.

Figure 7:
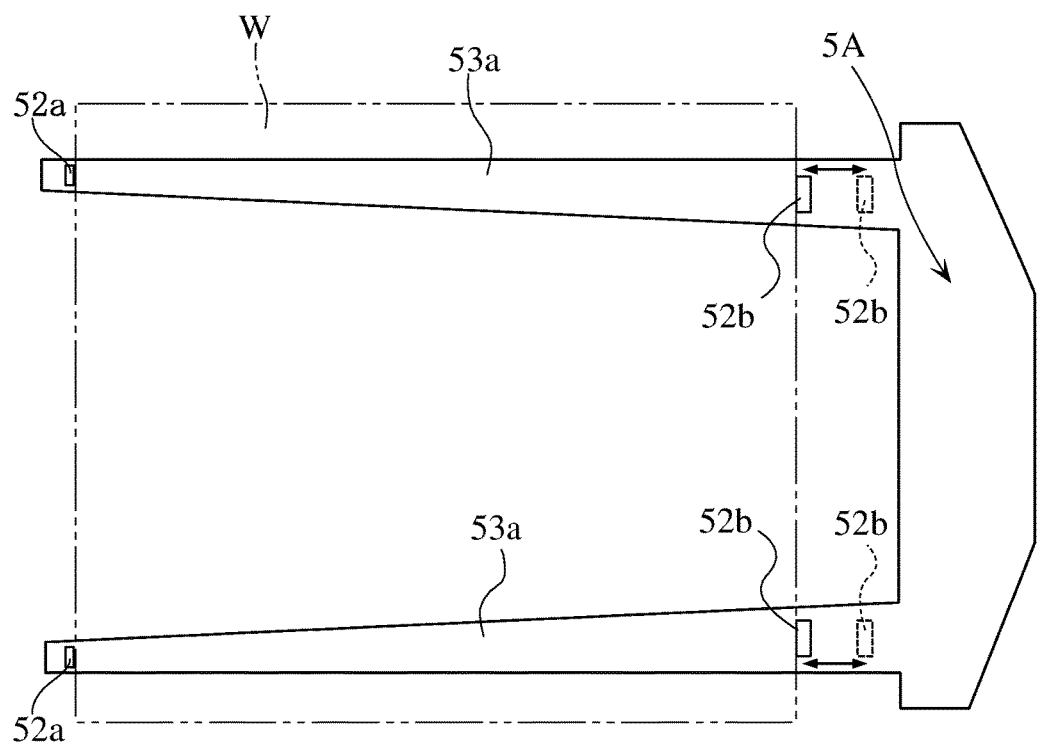
FIG. 7 is a plan view of a moving part of another example according to the first embodiment.

FIG. 7 is a plan view of the moving part 5A presented to illustrate a gripping mechanism. As in FIG. 7, the gripping mechanism includes stopper portions 52a, abutment portions 52b and a non-illustrated drive mechanism. Each stopper portion 52a is located on a distal end (forward end in the x direction, i.e., the moving direction of the moving part 5A) of the hand 53a and fixed to the upper surface. The stopper portions 52a come into contact with an edge of a workpiece W (forward edge in the moving direction of the moving part 5A), thereby preventing the workpiece W from advancing further. In the present embodiment, one stopper portion 52a is provided on each prong of the hand 53a. Each abutment portion 52b is provided on a base end (rearward end in the moving direction of the moving part 5A) of the hand 53a in a manner such that it can be moved in the x direction. Specifically, the abutment portion 52b is caused to move by the drive mechanism toward the workpiece W until abutting an edge of the workpiece W (the edge opposite to the edge abutting the stopper portion 52a). In the present embodiment, one abutment portion 52a is provided on each prong of the hand 53a. The drive mechanism is driven to move the abutment portions 52. When the drive mechanism is off, the abutment portions 52b are held by, for example, spring bias at a rearward position in the moving direction of the moving part 5A (see the abutment portions 52b represented by broken lines in FIG. 7). When the drive mechanism is turned on, the abutment portions 52b are moved forward in the moving direction of the moving part 5A until abutting against an edge of a workpiece W (see the abutment portions 52b represented by solid lines in FIG. 7). In this state, the workpiece W is gripped between the stopper portions 52a and the abutment portions 52b. The stopper portions 52a as well as the abutment portions 52b are not limited to any specific number, shape or location. In addition, the gripping mechanism may have a different configuration, and an electrostatic chuck may be used instead.

In the variation described above, electric power can still be supplied from the power storage 57 to the gripping mechanism (drive mechanism) without wiring that connects the guide body 3 and the moving part 5A.

In the first embodiment described above, the power storage 57 is provided. However, the present disclosure is not limited thereto. For example, to grip a workpiece W only during the time the moving part 5A (5B) is moving, no power supply is required during the time moving part 5A (5B) is not moving. In such a case, the power storage 57 can be omitted. Note that the power storage 57 is essential if power supply is required during the time the moving part 5A (5B) is not moving.

In the first embodiment described above, the magnetic-flux generating surfaces 33a and 33b of the magnet unit 33 are perpendicular to the y direction. In a second embodiment described below, the magnetic-flux generating surfaces 33a and 33b of the magnet unit 33 are perpendicular to the z direction.

Figure 8A:
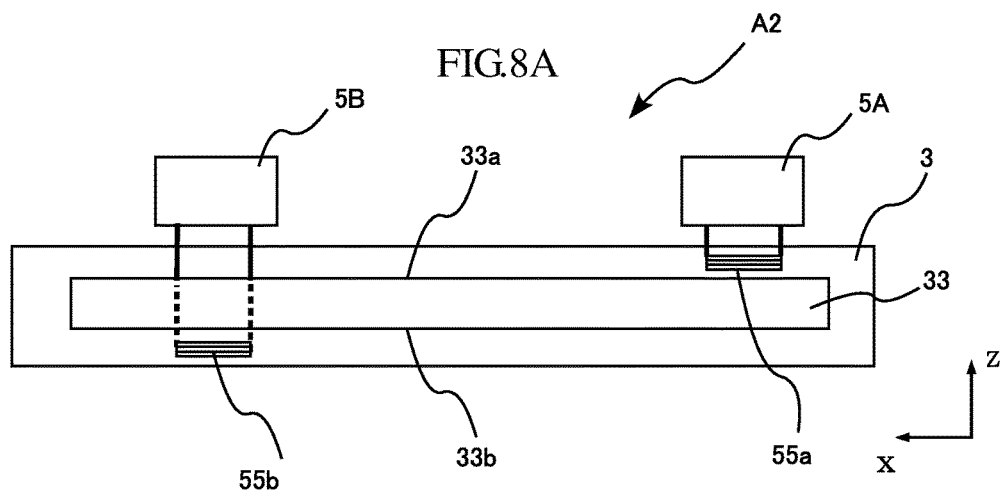
FIG. 8A is a side view and FIG. 8B is a plan view schematically showing a transfer robot according to a second embodiment.
Figure 8B:
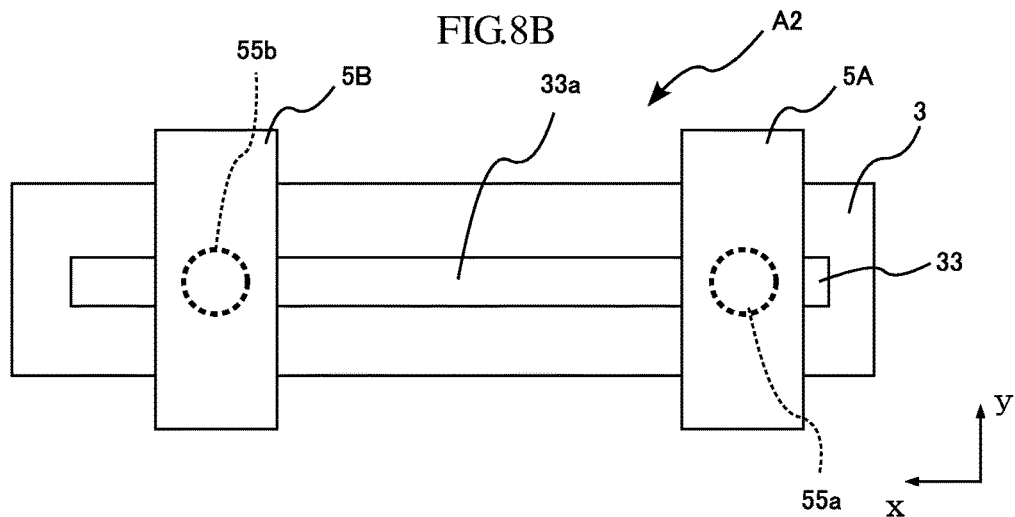
Figure 8C:
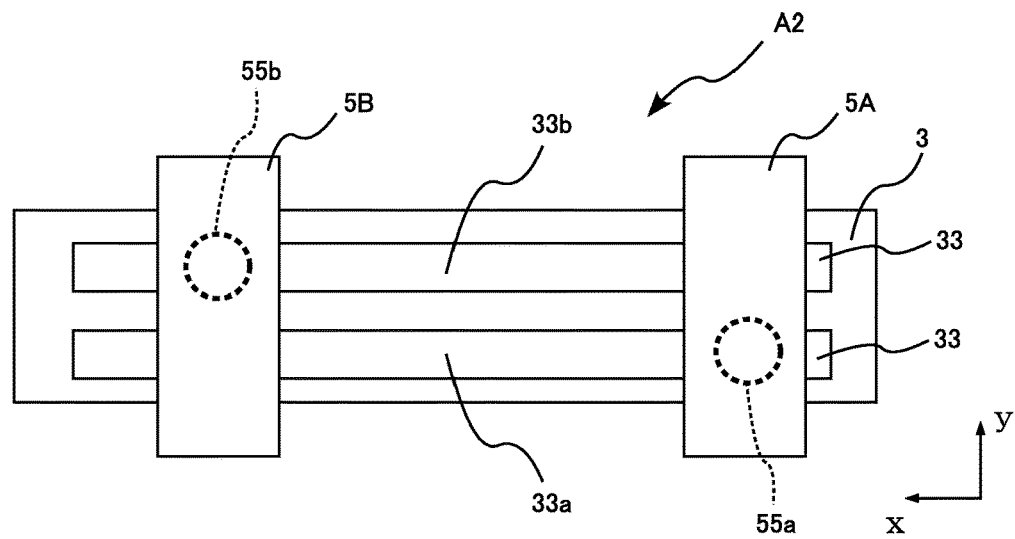
FIG. 8C is a plan view of another example of the second embodiment.

FIGS. 8A and 8B are schematic views of a transfer robot A2 according to the second embodiment. Specifically, FIG. 8A is a side view and FIG. 8B is a plan view. In FIGS. 8A and 8B, components that are the same as or similar to those of the transfer robot A1 according to the first embodiment (see FIGS. 1 to 4) are denoted by the same reference signs. As shown in FIGS. 8A and 8B, the transfer robot A2 differs from the transfer robot A1 of the first embodiment in that the magnetic-flux generating surfaces 33a and 33b of the magnet unit 33 are perpendicular to the z direction.

The permanent magnets of the magnet unit 33 are oriented with the N pole and the S pole pointing in the z direction, and hence the magnetic-flux generating surfaces 33a and 33b generate a magnetic flux in the z direction. In the present embodiment, as shown in FIG. 8A, the magnetic-flux generating surface 33a is an upper surface, whereas the magnetic-flux generating surface 33b is the surface opposite to the magnetic-flux generating surface 33a.

The coil 55a is located under the moving part 5A such that the coil plane faces the magnetic-flux generating surface 33a (i.e., the coil plane is horizontal). The coil 55b is located under the moving part 5B such that the coil plane faces the magnetic-flux generating surface 33b (i.e., the coil plane is horizontal). To this end, the coil 55b is connected to the moving part 5B with a wire that passes along a side surface of the magnet unit 33 (the side surface of the magnet unit 33 toward the back of FIG. 8A).

Also in the second embodiment, the coil 55a (55b) moves in the x direction with the moving part 5A (5B). Through the movement, the magnetic flux that intersects the coil plane of the coil 55a (55b) changes. As a result, the coil 55a (55b) can output AC power induced by electromagnetic induction. In this manner, the second embodiment can achieve the same advantages as those achieved by the first embodiment.

Note that the coil 55b may be arranged on the same side as the coil 55a to have the coil plane facing the magnetic-flux generating surface 33a. In this case, it is necessary to ensure that the coils 55a and 55b stay clear of each other as the moving parts 5A and 5B move. In a variation shown in FIG. 8C, two magnet units 33 may be provided. Then, the coil 55a is arranged to have the coil plane facing the magnetic-flux generating surface 33a of one of the magnet units 33, whereas the coil 55b is arranged to have the coil plane facing the magnetic-flux generating surface 33b of the other of the magnet units 33.

In the first and second embodiments described above, the magnet unit 33 is located inside the guide body 3. However, the present disclosure is not limited thereto. The magnet unit 33 may be located outside the guide body 3. In a third embodiment described below, the magnet unit 33 is located on a side surface of the guide body 3.

Figure 9A:
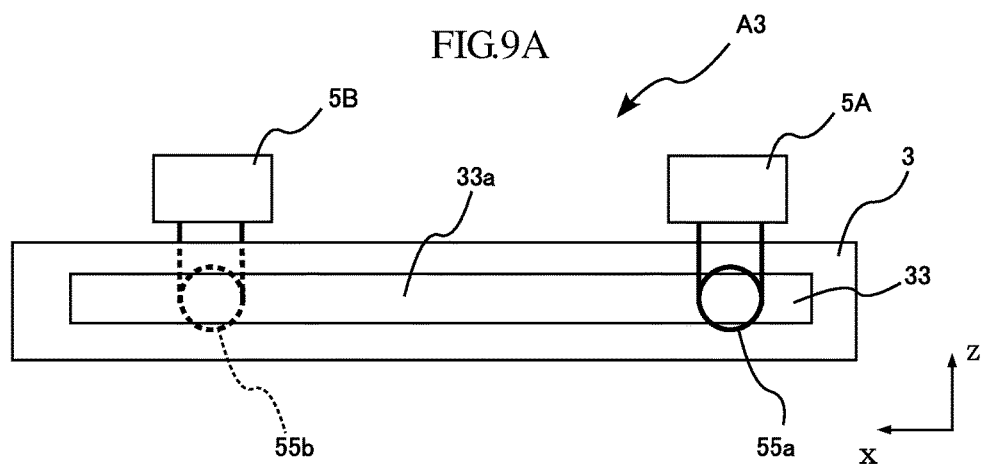
FIG. 9A is a side view and FIG. 9B is a plan view schematically showing a transfer robot according to a third embodiment.
Figure 9B:
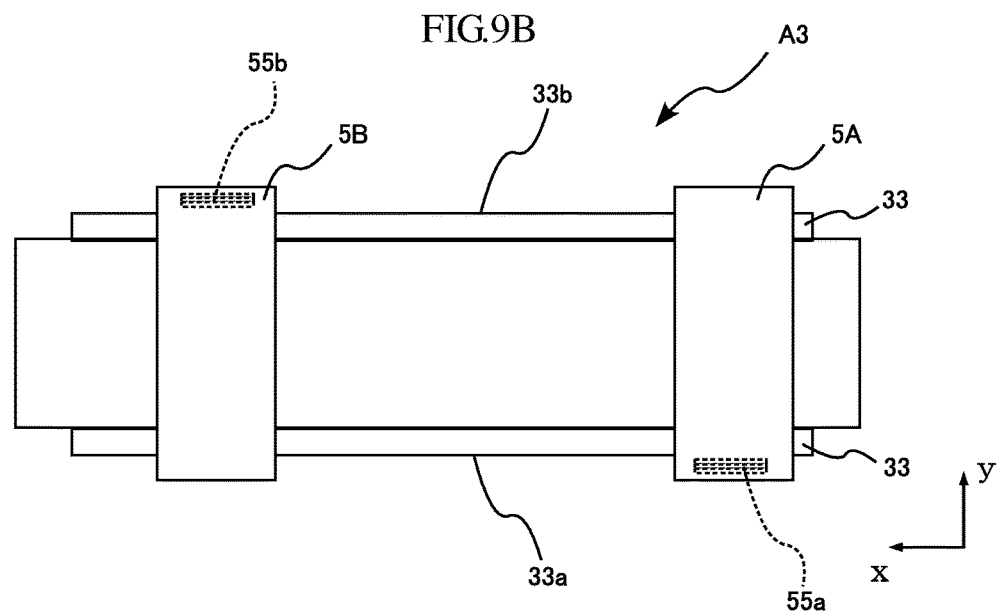

FIGS. 9A and 9B are schematic views of a transfer robot A3 according to the third embodiment. Specifically, FIG. 9A is a side view and FIG. 9B is a plan view. In FIGS. 9A and 9B, components that are the same as or similar to those of the transfer robot A1 according to the first embodiment (see FIGS. 1 to 4) are denoted by the same reference signs. As shown in FIGS. 9A and 9B, the transfer robot A3 differs from the transfer robot A1 of the first embodiment in that a magnet unit 33 is disposed on each side surface (surface perpendicular to the y direction) of the guide body 3.

One of the magnet units 33 is disposed on one side surface of the guide body 3 (the surface shown lower in FIG. 9B) such that the magnetic-flux generating surface 33a faces away from the guide body 3. Another magnet unit 33 is disposed on the other side surface (the surface shown upper in FIG. 9B) of the guide body 3 such that the magnetic-flux generating surface 33b faces away from the guide body 3.

The coil 55a is located under the moving part 5A with the coil plane facing the magnetic-flux generating surface 33a. The coil 55b is located under the moving part 5B with the coil plane facing the magnetic-flux generating surface 33b.

Also in the third embodiment, the coil 55a (55b) moves in the x direction with the moving part 5A (5B). Through the movement, the magnetic flux that intersects the coil plane of the coil 55a (55b) changes. As a result, the coil 55a (55b) can output AC power induced by electromagnetic induction. In this manner, the third embodiment can achieve the same advantages as those achieved by the first embodiment.

In a variation, the guide body 3 may be provided with one magnet unit 33 only on one side surface of the guide body 3. Then, the coils 55a and 55b may be arranged to face the same magnetic-flux generating surface 33a of the magnet unit 33. In this case, it is necessary to ensure that the coils 55a and 55b stay out of contact with each other as the moving parts 5A and 5B move. In another variation, one magnet unit 33 may be disposed on an upper or lower surface of the guide body 3. Then, depending on the orientation of the magnetic-flux generating surface 33a (33b) of the magnet unit 33, the coil 55a (55b) is disposed such that the coil plane faces the magnetic-flux generating surface 33a (33b).

In the first to third embodiments, the moving parts 5A and 5B are supported on the guide rail so as to be slidable to in linear motion. However, the present disclosure is not limited thereto. The transfer robot may be a horizontal articulated arm robot that moves a hand linearly by rotating a plurality of arms. In a fourth embodiment described below, such a transfer robot with horizontal articulated arm is described.

Figure 10A:
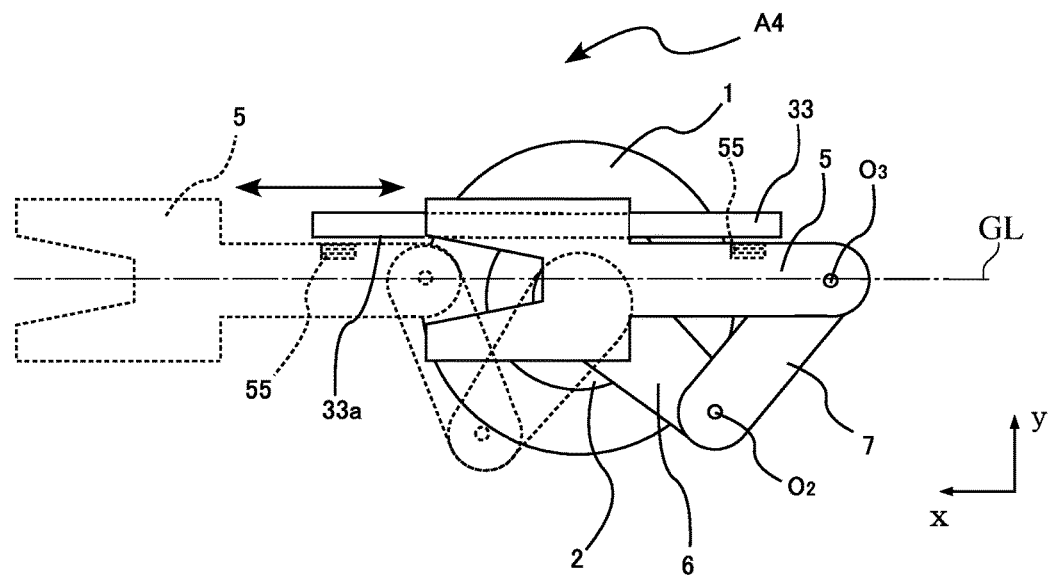
FIG. 10A is a plan view and FIG. 10B is a side view schematically showing a transfer robot according to a fourth embodiment.
Figure 10B:
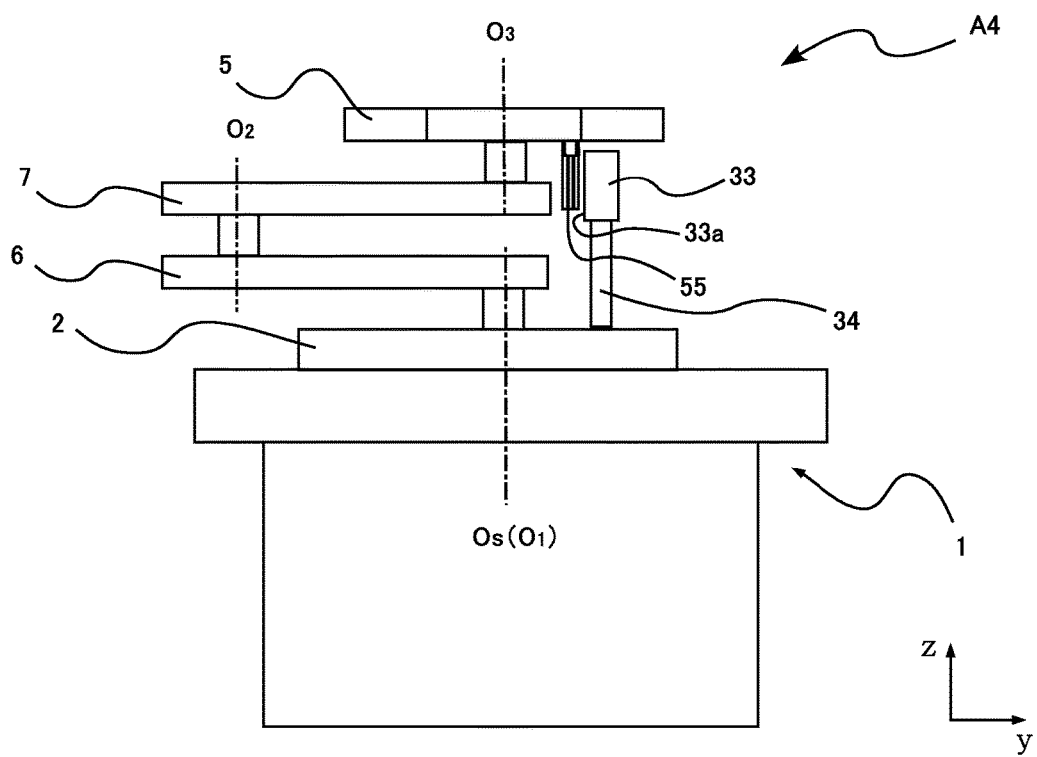

FIGS. 10A and 10B are schematic views of a transfer robot A4 according to the fourth embodiment. Specifically, FIG. 10A is a plan view of the transfer robot A4, whereas FIG. 10B is a side view of the transfer robot A4 as viewed from the right of FIG. 10A. In FIGS. 10A and 10B, components that are the same as or similar to those of the transfer robot A1 according to the first embodiment (see FIGS. 1 to 4) are denoted by the same reference signs. Unlike the transfer robot A1 of the first embodiment, the transfer robot A4 is a horizontal articulated arm robot as shown in FIGS. 10A and 10B.

As shown in FIGS. 10A and 10B, the transfer robot A4 includes a fixed part 1, a rotating part 2, a first arm 6, a second arm 7 and a hand 5. Similarly to FIG. 1, FIGS. 10A and 10B are based on the local coordinate system defined such that the x direction coincides with the moving direction of the hand 5.

The fixed part 1 and the rotating part 2 are similar to the fixed part 1 and the rotating part 2 of the first embodiment. The first arm 6 is rotatable relative to the rotating part 2, about a rotation axis $O_1$ that extends in the z direction. The rotation axis $O_1$ of the first arm 6 coincides with the rotation axis Os (see FIG. 10B). The second arm 7 is rotatable relative to the first arm 6, about a rotation axis $O_2$ that extends in the z direction. The rotation axis $O_2$ is located at the distal end of the first arm 6. The hand 5 is rotatable relative to the second arm 7, about a rotation axis $O_3$ that extends in the z direction. The rotation axis $O_3$ is located at the distal end of the second arm 7. The drive mechanism for actuating the first arm 6, the second arm 7 and the hand 5 are not illustrated and described. The first arm 6, the second arm 7 and the hand 5 rotate in synchronism so as to move the hand 5 along a travel path GL that extends horizontally linearly in the x direction (see an arrow shown in FIG. 10A). Preferably, the first arm 6, the second arm 7 and the hand 5 have a sufficient strength without compromising the lightness. Therefore, the first arm 6, the second arm 7 and the hand 5 may be made of aluminum, although they are not limited to any specific shape, dimensions and material.

When the hand 5 is not actuated or when the rotating part 2 rotates, the hand 5 is positioned at the initial position, i.e., a predetermined position above the rotating part 2. In FIG. 10A, the hand 5, the first arm 6 and the second arm 7 shown in solid lines are positioned at the initial position. In contrast, those shown in broken lines are positioned at the transfer position at which the hand 5 can receive or pass a workpiece W. The hand 5 linearly reciprocates at high speed between the initial position and the transfer position and rests either at the initial position or the transfer position.

The magnet unit 33 is located above the rotating part 2. The magnet unit 33 is fixed on the upper surface of the rotating part 2 by a magnet support 34 to have a longitudinal direction coinciding with the moving direction of the hand 5. The magnet unit 33 and the magnet support 34 are positioned to stay out of contact with the hand 5, the first arm 6 and the second arm 7. In the present embodiment, the magnetic-flux generating surface 33a is the side surface shown on the left in FIG. 10B. The longitudinal dimension of the magnet unit 33 is not specifically limited. To increase the travel distance of the hand 5, the longitudinal dimension of the magnet unit 33 may be increased to cover the travel range of the hand 5. Note that the longitudinal dimension of the magnet unit 33 may be decreased, on condition that a sufficient amount of electric power is generated to be supplied to the detection sensors 54 and other components.

The hand 5 is provided with a coil 55. The coil 55 is similar to the coil 55a (55b) of the first embodiment. The coil 55 is located under the hand 5 with the coil plane facing the magnetic-flux generating surface 33a. Similarly to the first embodiment, the hand 5 additionally includes, although not illustrated, a DC power supply circuit 56, a power storage 57, a communication unit 58, a control unit 59 and detection sensors 54. The DC power supply circuit 56, the power storage 57, the communication unit 58 and the control unit 59 are arranged inside the hand 5, while the detection sensors 54 are arranged on the upper surface of the hand 5.

Also in the fourth embodiment, the coil 55 moves in the x direction with the hand 5. Through the movement, the magnetic flux that intersects the coil plane of the coil 55 changes. As a result, the coil 55 can output AC power induced by electromagnetic induction. In this manner, the fourth embodiment can achieve the same advantages as those achieved by the first embodiment.

Although only one hand 5 is provided in the fourth embodiment, the present disclosure is not limited thereto. For example, another set of a first arm 6, a second arm 7 and a hand 5 may be provided to have two hands 5 in total. In this case, it is necessary to ensure that the two hands can move without interfering each other. Although providing two hands 5 complicates the structure, the work efficiency can be improved.

In the fourth embodiment described above, the magnetic-flux generating surface 33a is perpendicular to the y direction. However, the present disclosure is not limited thereto. In a fifth embodiment described below, the magnetic-flux generating surface 33a of the magnet unit 33 is perpendicular to the z direction.

Figure 11A:
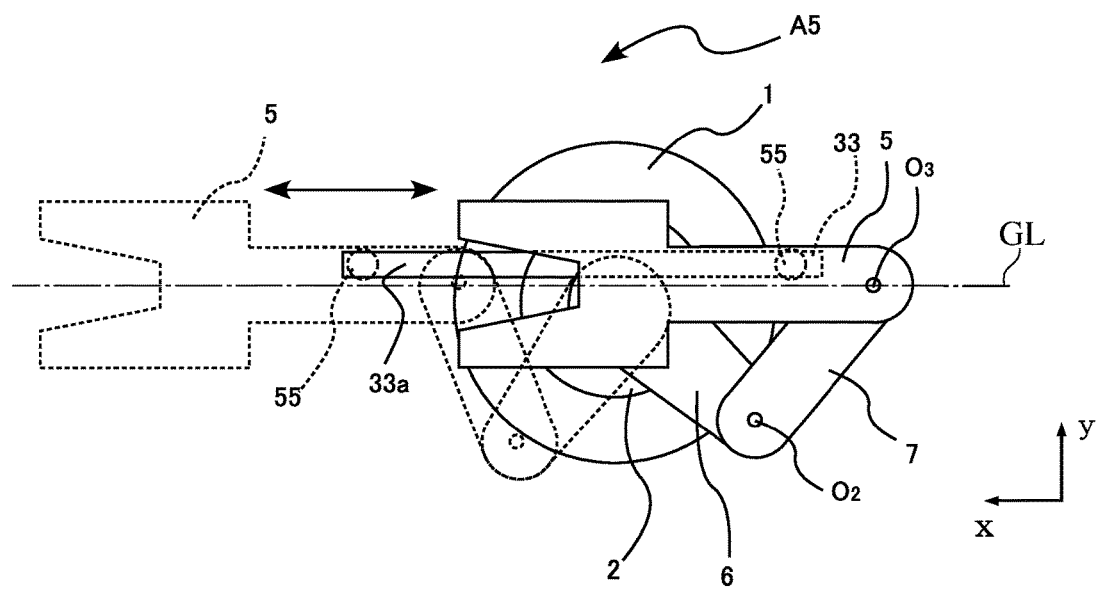
FIG. 11A is a plan view and FIG. 11B is a side view schematically showing a transfer robot according to a fifth embodiment.
Figure 11B:
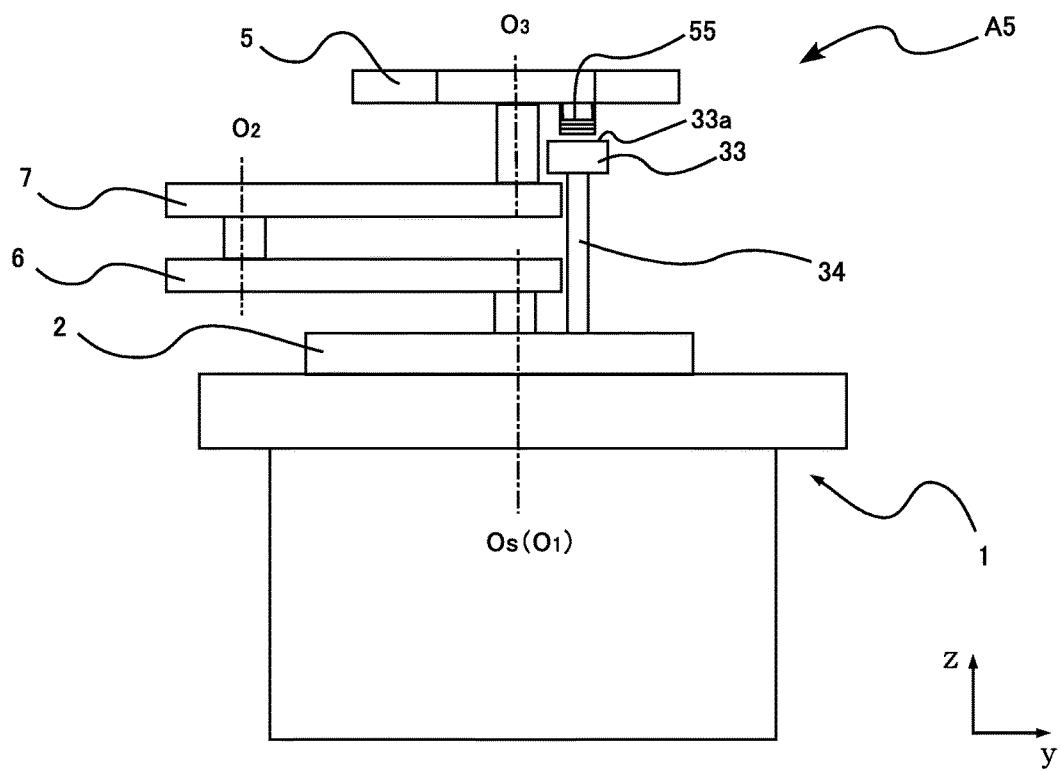

FIGS. 11A and 11B are schematic views of a transfer robot A5 according to the fifth embodiment. Specifically, FIG. 11A is a plan view and FIG. 11B is a side view of the transfer robot A5. In FIGS. 11A and 11B, components that are the same as or similar to those of the transfer robot A4 according to the fourth embodiment (see FIGS. 10A and 10B) are denoted by the same reference signs. As shown in FIGS. 11A and 11B, the transfer robot A5 differs from the transfer robot A4 of the fourth embodiment in that the magnetic-flux generating surface 33a of the magnet unit 33 is perpendicular to the z direction.

The magnetic-flux generating surface 33a of the magnet unit 33 generates a magnetic flux in the z direction. The coil 55 is located under the hand 5 with the coil plane facing the magnetic-flux generating surface 33a (i.e., the coil plane is oriented horizontal).

Also in the fifth embodiment, the coil 55 moves in the x direction with the hand 5. Through the movement, the magnetic flux that intersects the coil plane of the coil 55 changes. As a result, the coil 55 can output AC power induced by electromagnetic induction. In this manner, the fifth embodiment can achieve the same advantages as those achieved by the first embodiment.

In the fourth and fifth embodiments described above, the coil 55 is arranged on the hand 5 to make linear motion with the coil 55 with the hand 5. However, the present disclosure is not limited thereto. In a sixth embodiment described below, the coil 55 is moved along a curved path.

Figure 12A:
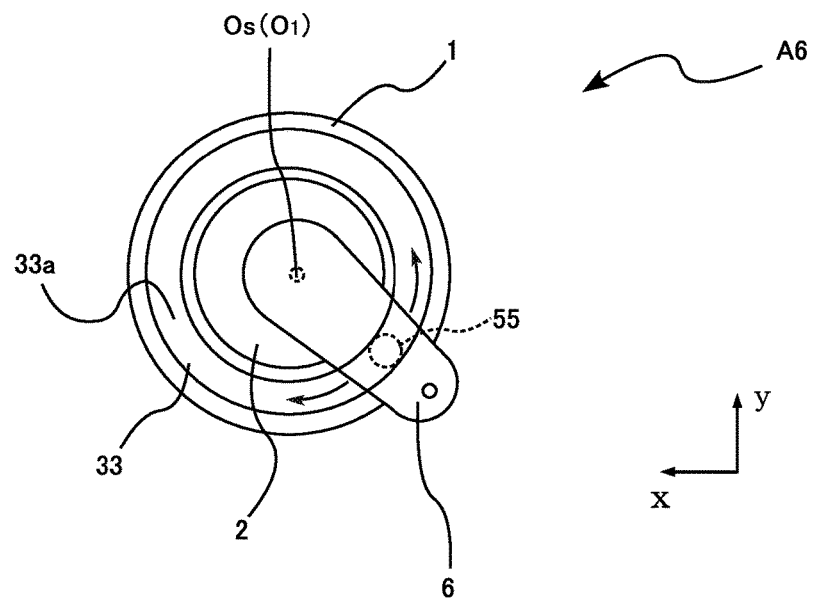
FIG. 12A is a plan view, with parts omitted.
Figure 12B:
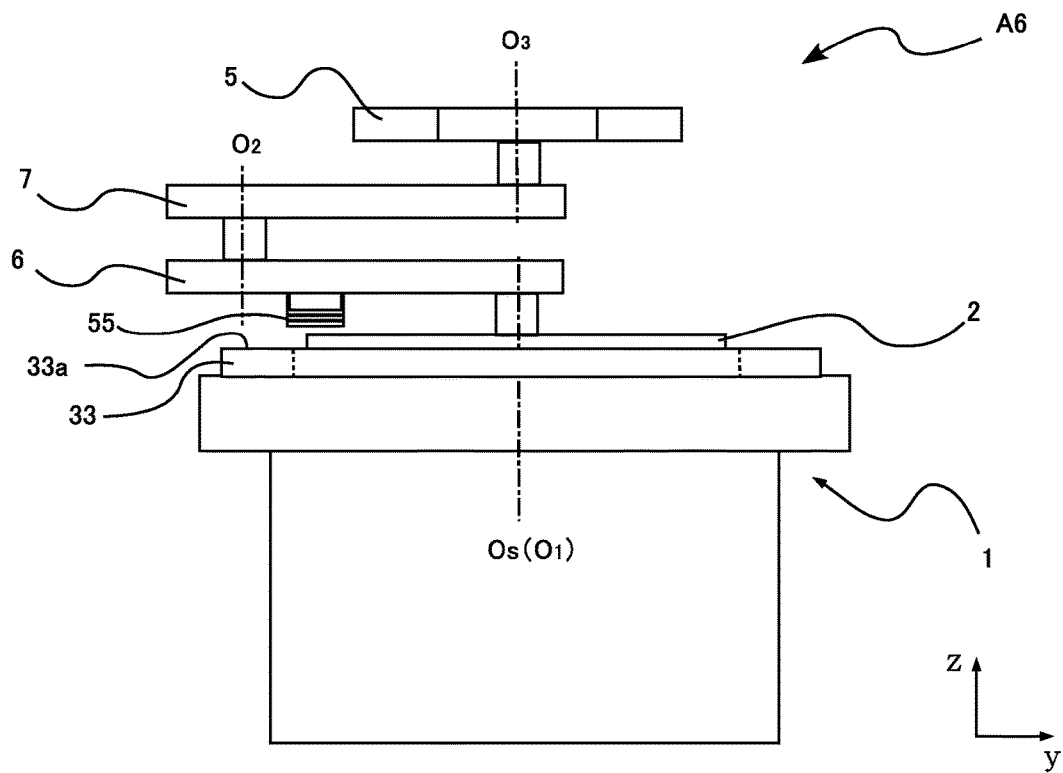
FIG. 12B is a side view schematically showing a transfer robot according to a sixth embodiment.

FIGS. 12A and 12B are schematic views of a transfer robot A6 according to the sixth embodiment. Specifically, FIG. 12A is a plan view of the transfer robot A6, with parts (the second arm 7 and the hand 5) omitted, whereas FIG. 12B is a side view of the transfer robot A6. In FIGS. 12A and 12B, components that are the same as or similar to those of the transfer robot A4 according to the fourth embodiment (see FIGS. 10A and 10B) are denoted by the same reference signs. As shown in FIGS. 12A and 12B, the transfer robot A6 differs from the transfer robot A4 of the fourth embodiment in that the magnet unit 33 is arranged on the upper surface of the fixed part 1 and that the coil 55 is located on the lower surface of the first arm 6.

The magnet unit 33 arranged on the upper surface (surface facing the first arm 6) of the fixed part 1 has an annular shape along the entire periphery of the fixed part 1. The magnet unit 33 includes permanent magnets arranged to have the N pole and the S pole pointing in the z direction. Therefore, the magnetic-flux generating surface 33a generates a magnetic flux in the z direction.

The coil 55 is located under the first arm 6 with the coil plane facing the magnetic-flux generating surface 33a. An insulating sheet may be provided on the lower surface of the first arm 6, and then the coil 55 may be arranged on the lower surface of the insulating sheet. The first arm 6 may be made of a material that transmits a magnetic flux. In that case, the coil 55 may be located inside the first arm 6.

Although not illustrated, the coil 55 is connected to the DC power supply circuit 56 located inside the hand 5. The connection between the coil 55 and the DC power supply circuit 56 is made via the wiring located inside the first arm 6 and the second arm 7. Alternatively, the DC power supply circuit 56, the power storage 57, the communication unit 58 and the control unit 59 may be located inside the first arm 6. Then, the detection sensors 54 mounted on the hand may be connected to the DC power supply circuit 56 via wiring.

To move the hand 5 in the x direction, the transfer robot A6 rotates the first arm 6 about the rotation axis $O_1$ relative to the rotating part 2. To change the moving direction of the hand 5 (x direction), the transfer robot A6 rotates the rotating part 2 about the rotation axis Os relative to the fixed part 1. With the rotation of the rotating part 2, the first arm 6 rotates about the rotation axis Os. In short, through the above motion, the first arm 6 moves horizontally along a circular path having the rotation axis Os (rotation axis $O_1$) as the center.

In the sixth embodiment, the coil 55 moves with the first arm 6 in a horizontal circular travel path, and the magnetic flux intersecting the coil plane changes as the coil 55 moves. As a result, the coil 55 can output AC power induced by electromagnetic induction. In this manner, the sixth embodiment can achieve the same advantages as those achieved by the first embodiment.

In the sixth embodiment, the magnet unit 33 has an annular shape that is continuous along the entire periphery of the fixed part 1. Alternatively, however, a portion of the magnet unit 33 may be omitted at a location where the coil 55 will not be located irrespective of the x direction movement of the hand 5 and the rotation of the rotating part 2.

In the sixth embodiment described above, the magnet unit 33 is located on the upper surface of the fixed part 1. However, the present disclosure is not limited thereto. For example, the magnet unit 33 may be located on a lateral surface of the fixed part 1. In a seventh embodiment described below, the magnet unit 33 is located on the lateral surface of the flange of the fixed part 1.

Figure 13A:
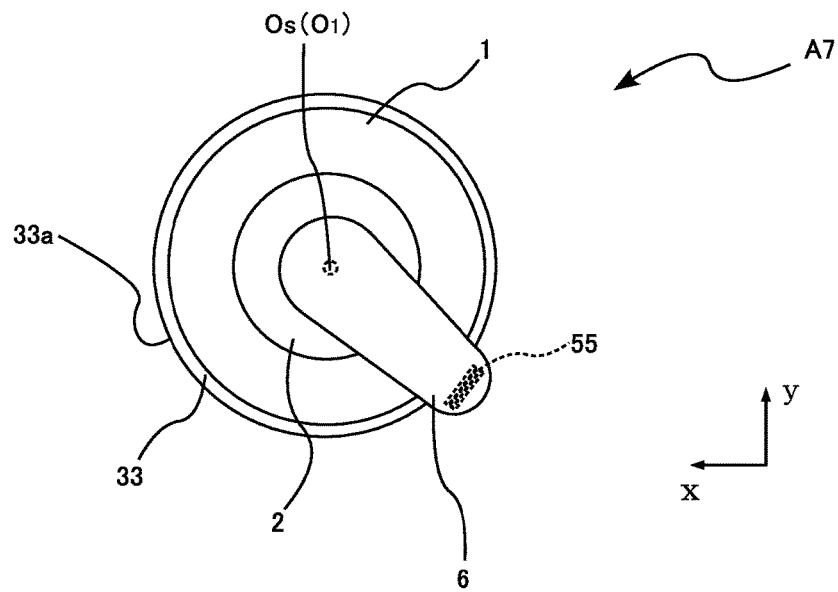
FIG. 13A is a plan view, with parts omitted.
Figure 13B:
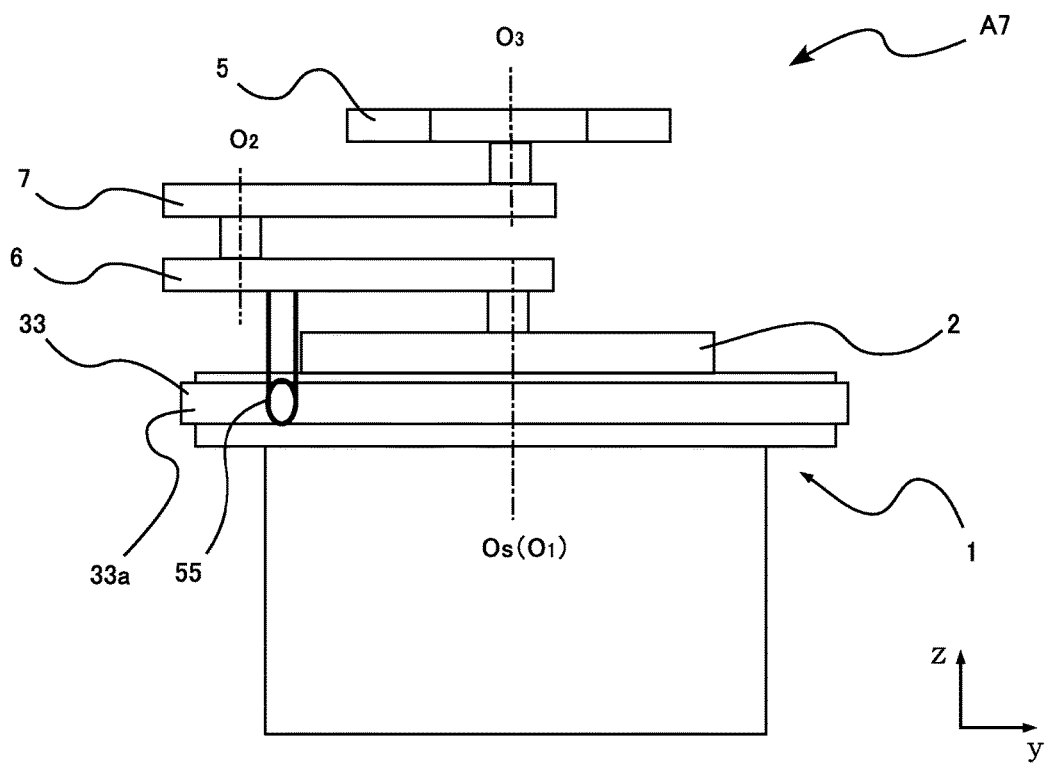
FIG. 13B is a side view schematically showing a transfer robot according to a seventh embodiment.

FIGS. 13A and 13B are schematic views of a transfer robot A7 according to the seventh embodiment. Specifically, FIG. 13A is a plan view of the transfer robot A7, with parts (the second arm 7 and the hand 5) omitted, whereas FIG. 13B is a side view of the transfer robot A7. In FIGS. 13A and 13B, components that are the same as or similar to those of the transfer robot A6 according to the fourth embodiment (see FIGS. 12A and 12B) are denoted by the same reference signs. As shown in FIGS. 13A and 13B, the transfer robot A7 differs from the transfer robot A6 of the sixth embodiment in that the magnet unit 33 is arranged on the lateral surface of the flange of the fixed part 1.

The magnet unit 33 is arranged on the lateral surface of the flange along the entire periphery. That is, the magnet unit 33 has a cylindrical shape having the central axis coinciding with the rotation axis Os (rotation axis $O_1$). The magnet unit 33 includes permanent magnets arranged to have the N pole and the S pole pointing in the radial direction. Therefore, the outer peripheral surface constituting the magnetic-flux generating surface 33a generates a magnetic flux in the radial direction.

The coil 55 is located under the first arm 6 with the coil plane facing the magnetic-flux generating surface 33a.

Also in the seventh embodiment, the coil 55 moves with the first arm 6 in a horizontal circular travel path, and the magnetic flux intersecting the coil plane of the coil 55 changes. As a result, the coil 55 can output AC power induced electric current by electromagnetic induction. In this manner, the fourth embodiment can achieve the same advantages as those achieved by the first embodiment.

The z-direction dimension of the magnet unit 33 may be increased to restrict that the magnetic flux intersecting the coil plane of the coil 55 changes too greatly in response to the up and down movement of the rotating part. For the same purpose, the z-direction dimension of the coil 55 may be increased.

In the first to seventh embodiments described above, the transfer robots A1 to A7 transport a rectangular workpiece W. However, a workpiece W may be a circular workpiece as a semiconductor wafer.

In the first to seventh embodiments described above, the transfer robots A1 to A7 are vacuum robots used in a vacuum environment. However, the present disclosure is not limited thereto. The technical features according to the present disclosure are applicable also to atmospheric robot used in an atmospheric environment.

The transfer robots according to the present disclosure are not limited to the embodiments described above, and many design changes may be made to the specific configurations of various parts of the transfer robots.

The invention claimed is:

1. A transfer robot comprising:
   a supporting part;
   a moving part supported by the supporting part and movable along a predetermined travel path, the moving part provided with a hand for carrying a workpiece;
   a magnet unit disposed at the supporting part and extending longitudinally along the travel path, the magnetic unit generating magnetic flux perpendicular to the travel path; and
   a coil disposed at the moving part and intersecting the magnetic flux,
   wherein the magnetic flux is different at positions along the travel path.

2. The transfer robot according to claim 1, wherein the moving part comprises: a rectifying circuit that rectifies an electric current flowing through the coil; and a power storage that stores direct current power outputted from the rectifying circuit.

3. The transfer robot according to claim 1, wherein the magnet unit comprises a plurality of permanent magnets spaced apart from each other along the travel path, and each permanent magnet has an N pole and an S pole that are spaced apart from each other in a direction perpendicular to the travel path.

4. The transfer robot according to claim 3, wherein any two adjacent magnets of the plurality of permanent magnets have mutually opposite N-S directions.

5. The transfer robot according to claim 3, wherein the N pole and the S pole of each permanent magnet are spaced apart from each other in a horizontal direction.

6. The transfer robot according to claim 3, wherein the N pole and the S pole of each permanent magnet are spaced apart from each other in a vertical direction.

7. The transfer robot according to claim 3, wherein each permanent magnet is elongated in the direction perpendicular to the travel path.

8. The transfer robot according to claim 1, wherein the supporting part comprises a straight guide rail extending horizontally, and the moving part moves on the guide rail.

9. The transfer robot according to claim 1, further comprising a plurality of arms configured to move the moving part along the travel path, wherein the travel path is a horizontal, straight path.

10. The transfer robot according to claim 1, wherein the moving part is rotatable relative to the supporting part.

11. The transfer robot according to claim 1, wherein the moving part comprises an electrical load that is driven by electric power outputted from the coil.

12. The transfer robot according to claim 11, wherein the electrical load comprises: a detection sensor that detects a workpiece; and a communication unit that transmits a result of detection by the detection sensor.

13. The transfer robot according to claim 11, wherein the electrical load comprises a gripping mechanism that grips a workpiece.

14. The transfer robot according to claim 1, further comprising at least one additional moving part.

* * * * *